Figure 1:
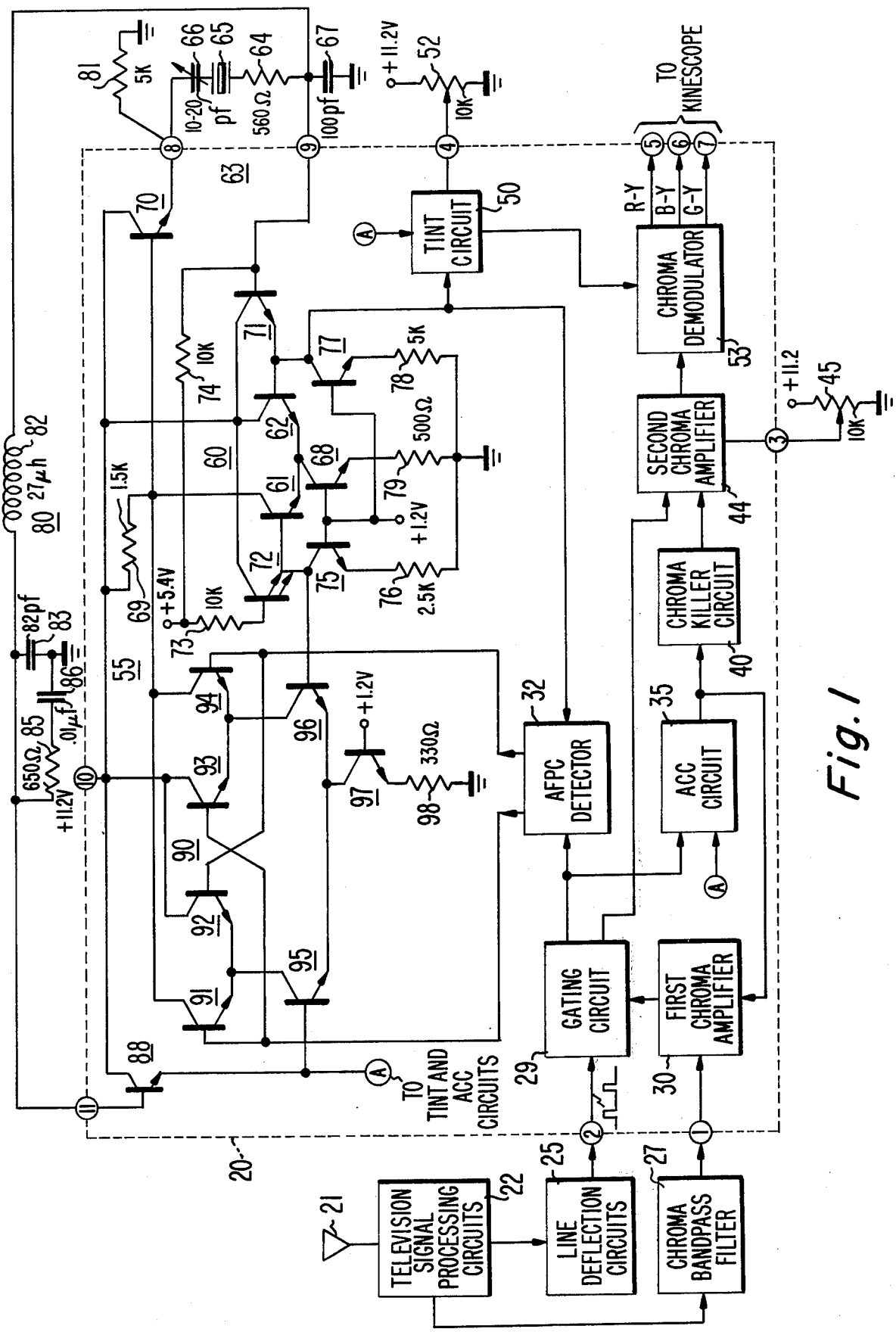

United States Patent [19]

Harwood

[11] 4,020,500
[45] Apr. 26, 1977

[54] CONTROLLED OSCILLATOR

[75] Inventor: Leopold Albert Harwood, Somerville, N.J.

[73] Assignee: RCA Corporation, New York, N.Y.

[22] Filed: Nov. 19, 1975

[21] Appl. No.: 633,462

[52] U.S. Cl. .................................. 358/19; 331/8
[51] Int. Cl.² ........................................ H04N 9/46
[58] Field of Search ..................... 358/17, 19, 28; 331/1 R, 8, 17, 18, 27; 178/69.5 CB

[56] References Cited
UNITED STATES PATENTS 3,743,764   7/1973   Wittmann ........................... 358/28

Primary Examiner—Robert L. Richardson
Attorney, Agent, or Firm—Eugene M. Whitacre; Ronald H. Kurdyla

[57] ABSTRACT

A controlled oscillator suitable for construction largely in integrated circuit form includes an oscillating amplifier stage and a regenerative feedback loop including a resonant frequency determining element coupled to the amplifier stage for providing an oscillatory reference signal. A phase shift network is provided outside the loop for shifting the phase of the oscillatory signal a predetermined amount. A control circuit which is supplied with the phase shifted oscillatory signal to produce anti-phase signal outputs is responsive to control signal representative of the phase and/or frequency of a predetermined reference signal for selecting portions of the anti-phase output signals. A combining network sums the oscillatory signal and the selected portions from the control circuit to produce a combined signal with a resultant phase which is supplied to the oscillating amplifier stage for maintaining the oscillatory signal in desired relation with the reference signal.

15 Claims, 2 Drawing Figures

CONTROLLED OSCILLATOR

This invention relates to signal oscillator circuits and, more particularly, to voltage controlled oscillators which exhibit readily reproducible amplitude and phase characteristics and are controllable with respect to a preferred operating phase and frequency.

Circuits employing the present invention are particularly adapted to integrated circuit techniques. As used herein, the term integrated circuit refers to a unitary or monolithic semiconductor device or chip which is the equivalent of a network of interconnected active and passive circuit elements.

In many types of electrical apparatus, there is a requirement for a controllable oscillator which exhibits a substantially symmetrical or balanced control range and reproducible unit-to-unit performance. These characteristics are especially desirable for voltage controlled oscillators which are conventionally employed in the chrominance channel of a color television receiver in order to provide a reference signal for demodulating the received chrominance information. Such oscillators are typically controlled in response to a voltage proportional to the phase and/or frequency difference between the locally generated oscillator reference signal and the burst signal component of the received chrominance signal.

Known types of voltage controlled oscillators frequently employ one or more resistance-capacitance (RC) phase shift networks in the feedback loop of the oscillator in order to achieve a symmetrical or balanced range of oscillator control. The phase shift networks may include fixed value components which provide a predetermined amount of signal phase shift or may include variable components which are controlled by associated circuitry in response to a suitable control signal respresentative of desired phase and frequency operation of the oscillator.

Voltage controlled oscillators employing RC phase shift networks for the purpose described above may undesirably exhibit an unbalanced control range. For example, the operating characteristics of the phase shift network may be upset by loading by associated circuits, or by variations in the tolerances of the resistive and capacitive elements forming the phase shift network. The latter result is a particularly noticeable in integrated RC phase shift networks, since the absolute values of integrated resistors and capacitors may deviate by thirty percent or more from a nominal value. Such factors make it difficult to predict the resulting phase shift and therefore the uncorrected oscillator phase and frequency as well as the range of oscillator control. Attempts to compensate for these factors to achieve a predictable nominal output phase and symmetrical control range for the oscillator have typcially involved the use of a "centering" potentiometer to tailor the circuit for balanced control of the oscillator. However, relatively large discrete components such as potentiometers and a need for their adjustment are relatively costly and/or unreliable and therefore are generally undesirable.

Accordingly, apparatus in accordance with the present invention comprises an oscillator which is controllable with respect to a preferred reference phase and operating frequency and which provides predictable performance. Such an oscillator comprises an amplifier having input and output terminals and a reactive circuit having a predetermined resonant frequency response coupled in a closed circuit loop between the input and output terminals of the amplifier for providing regenerative feedback of a sufficient magnitude to produce an oscillatory signal with a reference phase. Means are provided outside the feedback system for phase shifting the oscillatory signal a predetermined amount in relation to the reference phase to produce a phase shifted signal, and means are also provided for supplying control signals representative of the phase and/or frequency of the oscillatory signal with respect to a predetermined reference signal. A control circuit is coupled to the phase shifting means for receiving the phase shifted signal to produce anti-phased signal outputs and is responsive to the control signals for selecting portions of the anit-phase output signals. A combining network sums the oscillatory signal and the selected anti-phase output signals portions from the control circuit to produce a combined signal having a resultant phase which is supplied to the amplifier for maintaining the oscillatory signal in desired relation with the predetermined reference signal.

Figure 2:
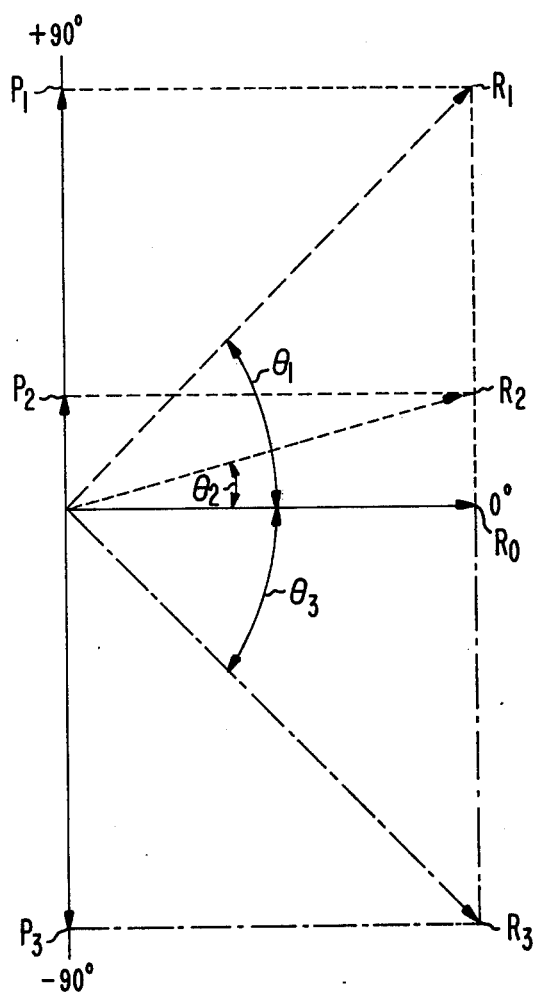

For a detailed explanation, reference is made to the following specification and accompanying drawings, in which:

FIG. 1 is a diagram partially in block form and partially in schematic circuit form of a portion of television receiver signal processing circuitry employing the invention; and FIG. 2 is a graph useful in explaining the operation of the circuitry shown in FIG. 1.

Referring to FIG. 1, there is shown a portion of a color television receiver including a complete chroma processing circuit suitable for construction on a single, monolithic integrated circuit chip 20 (indicated by the dashed outline). In FIG. 1, certain additional chroma processing circuits of known construction have not been illustrated in detail, as such details are not considered essential for an understanding of the present invention.

Color television signals are received by an antenna 12 and are processed by standard color television signal processing circuits, indicated by block 22. Signal processing circuits 22 comprise, for example, a tuner having radio frequency (R.F.) amplifier and converter stages for amplifying and translating the received signals to intermediate frequency (I.F.) signals. The I.F. signals are amplified by several amplifier stages including appropriate frequency selective elements and are coupled to a video detector, all within block 22. Automatic gain control apparatus also is associated with the R.F. and I.F. amplifiers. Synchronizing signal components included in the received signal are separated within block 22 and horizontal (line) deflection pulses are coupled to line deflection apparatus 25 in the receiver.

Additional outputs (not shown) such as sound signal components, luminance signal components and vertical deflection synchronizing components are also coupled from signal processing circuits 22 to other portions of the receiver in a well known manner.

Detected video signals produced at the output of signal processing circuits 22 are coupled to a chroma bandpass filter network 27 arranged to select color-representative signal information contained in the detected video signals. The color-representative signals comprise, for example, color difference signal information (R-Y, B-Y and G-Y) imposed as amplitude modulation at selected phases of a suppressed color subcarrier wave. Bandpass filter network 27 also passes the color burst component of the transmitted signal. Under the broadcast standards employed in the U.S., which are typical standards for purposes of the present discussion, color burst information is transmitted during a relatively short synchronizing interval following the end of each image-representative portion of the signal corresponding to a horizontal scanning line. The color burst typically consists of about eight cycles of an unmodulated waveform having a frequency equal to that of a reference color subcarrier signal (approximately 3.58 MHz).

The color burst and modulated, suppressed subcarrier signals are coupled from filter 27 via an input terminal 1 of an integrated circuit 20 including chrominance signal processing circuitry. Keying signals derived from the line deflection apparatus 25 are supplied to a gating circuit 29 of integrated circuit 20 via a terminal 2. The keying signal is illustrated as including positive-going pulses of relatively short duration (e.g., the line blanking interval) separated by a relatively longer duration interval (the image-representative portion of the line scanning cycle).

The circuitry within the confines of integrated circuit 20 comprises a gain controlled first chroma amplifier 30 which serves to controllably amplify both the suppressed subcarrier and burst components of the composite chroma signal supplied from chroma bandpass filter 27. Amplified burst signals from the first chroma amplifier 30 are supplied via gating circuit 29 to an automatic frequency and phase control (AFPC) detector 32 and to an automatic color control (ACC) circuit 35.

The AFPC detector 32 is also supplied with an oscillatory reference signal from a voltage controlled chroma oscillator circuit 55. The AFPC detector 32 may, for example, be of the type described in U.S. Pat. No. 3,740,456 issued June 19, 1973, to Leopold A. Harwood and assigned to RCA Corporation. AFPC detector 32 provides output control signals representative of the phase and/or frequency relationship between the transmitted burst component and the reference signal produced by voltage controlled oscillator 55. Filtered output signals from AFPC detector 32 are applied to a control stage 90 of voltage controlled oscillator 55, the operation of which will be described in greater detail subsequently.

ACC circuit 35 is also supplied with burst information from gating circuit 29, and provides a control voltage for controlling the gain of first chroma amplifier 30. The control voltage from ACC circuit 35 is also supplied to a color killer circuit 40, which produces a control signal for disabling a second chroma amplifier 44 during a monochrome or weak color signal transmission to prevent the receiver from producing spurious colors. The modulated chroma subcarrier signal component which is provided at a second output of gating circuit 29 is further amplified by second chroma amplifier 44.

A chroma gain control potentiometer 45 is coupled to an operating voltage supply of about +11.2 volts and has a wiper arm coupled to an input of second chroma amplifier 44 via a terminal 3. Potentiometer 45 provides a means of viewer control of the saturation (color intensity) of images produced on the kinescope of the television receiver (not shown).

A tint circuit 50 serves to introduce a controllable phase shift to the reference signal provided from voltage controlled oscillator 55 prior to the application thereof to a chroma demodulator 53. Adjustment of the phase shift provided by tint circuit 50 is permitted by means of a tint control potentiometer 52, which is coupled to an operating supply of about +11.2 volts and has a wiper arm coupled to an input of tint circuit 50 via a terminal 4. Potentiometer 52 is adjustable by the viewer to vary the relative phase of the burst component and the reference signal supplied from voltage controlled oscillator 55 to the deomodulator 53 so that the viewer may alter the tint of the reproduced image to suit his individual preference.

Chroma demodulator 53 also receives amplified chrominance subcarrier signals from the second chroma amplifier 44. Chroma demodulator 53 (which may include appropriate matrixing circuits) provides color difference signals R-Y, G-Y and B-Y at terminals 5, 6 and 7. Such color differences signals are ultimately combined with luminance (Y) signals to produce red (R), green (G) and blue (B) color-representative signal components which are applied in a known manner to the kinescope of the television receiver by suitable kinescope drive circuits (not shown).

Chroma processing circuit 20 further includes a voltage controlled oscillator constructed according to the present invention and indicated generally by the reference number 55. Oscillator 55 includes a closed loop oscillator stage 60 and a separate phase control stage 90.

Oscillator stage 60 is arranged to produce a continuous wave signal at the nominal chroma subcarrier frequency (e.g., about 3.58 MHz according to television standards in the U.S.). Oscillator stage 60 comprises an amplifier formed by emitter coupled transistors 61 and 62 which are arranged to amplify and limit signals in the oscillator loop, and an external frequency determining resonant circuit 63 coupled between terminals 8 and 9. Resonant circuit 63 comprises a series combination of a bandwidth determining resistor 64, a narrow band crystal filter between terminals 8 and 9. A filter capacitor 67 is coupled between resistor 64 and ground.

A current source transistor 68 is coupled from the interconnected emitters of amplifier transistors 61 and 62 to a point of reference potential (ground) via a bias resistor 79. A load resistor 69 is coupled between a collector of transistor 61 and an operating supply of about +11.2 volts at terminal 10. A collector of transistor 62 is directly connected to the operating supply. Regenerative AC feedback to sustain oscillations is provided by a feedback loop including an emitter follower buffer transistor 70, resonant circuit 63 and a second emitter follower buffer transistor 71. The base of transistor 70 is connected to the output collector electrode of amplifier transistor 61 for receiving signals developed across load resistor 69 while the emitter of transistor 71 is connected to a base input of amplifier transistor 62. A bias resistor 81 is connected to terminal 8 and couples the emitter of transistor 70 to ground.

Operating bias for the oscillator amplifier transistors 61, 62 provided by an arrangement comprising a dual-emitter bias transistor 72 with a collector connected to the operating supply, a base coupled to a bias supply (about +5.4 volts) via a bias resistor 73, and an emitter connected to a base of amplifier transistor 61. A bias resistor 74 couples the bias supply to the base of transistor 71. The bias arrangement further comprises bias transistor 75 with a base connected to the base of current source transistor 68, a collector connected to an emitter of transistor 72, and an emitter returned to ground by a bias resistor 76. A further bias transistor 77 has a collector connected to the emitter of buffer transistor 71, a base connected to the base of current source transistor 68, and an emitter returned to ground via a bias resistor 78. A source of direct bias potential (about +1.2 volts) is applied to the base electrodes of transistors 68, 75 and 77 for establishing quiescent currents.

Oscillatory signals related in phase and frequency to the burst component of the received chrominance signal are supplied from the emitter of transistor 71 to tint circuit 50 and AFPC detector 32. Similarly phased oscillatory signals are coupled from the junction of resistors 64 and capacitor 67 to an external phase shift network 80 which is outside the regenerative feedback loop of oscillation stage 60.

Phase shift network 80 comprises an inductor 82 with one end connected to the junction of resistor 64 and capacitor 67. A capacitor 83, coupled between the other end of inductor 82 and ground, is shunted by the series combination of a resistor 85 and a capacitor 86. Phase shift netowrk 80 is arranged to have a relative low Q (figure or merit) of about unity, while imparting a lagging phase shift of about ninety degrees at resonance (e.g., 3.58 MHz) to the signal supplied from oscillator stage 60.

Phase shifted signals from network 80, hereinafter referred to as quadrature signals, are coupled to the phase control stage 90 of voltage controlled oscillator 55 and to the tint and ACC circuits 50 and 35 via terminal 11 and an emitter follower buffer transistor 88.

Phase control stage 90 comprises a balanced amplifier with first and second similar pairs of differentially connected transistors 91, 92 and 93, 94 responsive to control signals supplied from AFPC detector 32, and a third pair of differentially connected transistors 95 and 96 supplied with the quadrature signal from the emitter of transistor 88. Transistors 91 and 92 have emitter electrodes coupled together and collector electrodes respectively coupled to the collector electrodes of transistors 94 and 93. The joined collectors of transistors 92 and 93 are directly connected to the operating supply, and the joined collectors of transistors 91 and 94 are coupled to load resistor 69. The base electrodes of transistors 91 and 93 are connected in common to a control signal output of AFPC detector 32 and the base electrodes of transistors 92 and 94 are connected in common to a bias output of AFPC detector 32.

Emitter coupled transistors 95 and 96 have collector electrodes respectively coupled to the joined emitters of transistors 91, 92 and 93, 94. The collector-emitter path of a current source transistor 97 couples the interconnected emitters of transistors 95 and 96 to ground via a bias resistor 98. A source of direct bias potential of about +1.2 volts is applied to a base of transistor 97 to determined the quiescent current. Operating bias is supplied to the base of transistor 96 from the +5.4 volt bias supply via the collector of transistor 75, and similar operating bias is supplied to the base of transistor 95 via transistor 88, inductor 82 and resistor 74. The base of transistor 95 also receives the quadrature signal from the emitter of transistor 88.

The operating of voltage controlled oscillator 55 shown in FIG. 1 will now be described.

In a normal operating mode for proper demodulation of the received chrominance signal, it is desired that the output signal provided from oscillator stage 60 at terminal 9 have a frequency equal to that of the received burst component and be in quadrature phase (90°) relationship therewith. The desired signal relationship is provided by phase control stage 90 in cooperation with oscillator stage 60 as follows.

Transistors 61 and 62 of oscillator stage 60 are biased for self-limiting operation to allow the oscillator signal to reach a predetermined amplitude across load resistor 69. This signal is supplied at a relatively low output impedance from the emitter of follower transistor 70 to tune circuit 63. The level at which limiting occurs specifies the peak-to-peak voltage of the oscillator ouput signal at terminal 9.

Crystal 65 has a resonant frequency about the chrominance subcarrier frequency of 3.58 MHz, the resonant frequency being more precisely determined by adjusting variable capacitor 66. Crystal 65 also filters the higher order harmonics of the oscillatory rectangular waveform at terminal 8 to produce a sinusoidal waveform at terminal 9 (hereinafter referred to as the "in phase signal"). This signal is phase shifted substantially ninety degrees by circuit 80.

A resulting continuous wave quadrature signal is applied to the third pair of differentially connected transistors 95, 96 via terminal 11 and transistor 88 to produce equal but oppositely phased outputs which are controllably supplied to load resistor 69 by varying the conduction of transistors 91–94 of the upper differential pairs as a function of the magnitude of the control signals from the output of AFPC detector 32. AFPC detector 32 is supplied with burst information from gating circuit 29 and with the in-phase signal from oscillator stage 60 to produce control signals representative of the phase and/or frequency difference between the in-phase signal and the burst component. The operation of AFPC detector 32 is discussed in more detail in U.S. Pat. No. 3,470,456 previously referred to.

When the oscillator reference signal at terminal 9 and the received burst signal are in proper phase and frequency relaionship (i.e., same frequency and 90°phase relationship), AFPC detector 32 produces control singals on each output line which are of equal magnitude. Transistors 91 and 94 therefore each conduct equal but opposite signal currents corresponding to the quadrature signal supplied from transistors 95 and 96, which cancel when combined in resistor 69. Thus, when the output of the oscillator stage 60 is of proper phase and frequency relative to burst, phase control stage 90 does not affect the output of oscillator stage 60. When the oscillator and burst signals deviate from the desired relationship, AFPC detector 32 develops output control signals which are unequal in magnitude. Transistors 91 and 94 then conduct unequal amounts of quadrature signal currents to produce a resultant quadrature signal component in resistor 69 with a magnitude and polarity determined by the relative magnitude and polarity of control signals provided by AFPC detector 32. In this manner, positive or negative fractions of the quadrature signal are developed across resistor 69 in accordance with the magnitude and polarity of control signals applied to the base electrodes of transistors 91, 92 and 93, 94 from AFPC detector 32. Symmetrical control is provided by the balanced amplifier operation of phase control stage 90.

It should be noted that in the quiescent condition of phase control stage 90, the current supplied by current source transistor 97 divides substantially equally between similarly biased transistors 95 and 96. With equal quiescent outputs from AFPC detector 32 (i.e., no error signal), the collector currents of transistors 95 and 96 divide substantially equally in the succeeding first and second pairs of differentially connected transistors 91, 92 and 93, 94. The collector currents of transistors 91 and 94 are combined in load resistor 69 to provide a quiescent load current which is one-half the current supplied via transistor 97. It should also be noted that when oscillator stage 60 is correctly turned to the color subcarrier frequency, once the correctly phased signal is provided across load resistor 69, AFPC detector and phase control stage 90 will return to a zero error condition.

The effect of combining the signals from oscillator stage 60 and phase control stage 90 is illustrated in the diagram of FIG. 2.

FIG. 2 depicts a vector diagram illustrating the range of phase variation of the combined signal developed across resistor 69. A vector $R_o$ represents the output signal from oscillator stage 60 with a nominal reference phase of 0°. The magnitude of the oscillator signal $R_0$ is substantially constant as determined by the limiting action of the oscillator amplifier 61, 62. In this example, the signal $R_o$ also corresponds to a resultant signal developed across resistor 69 in the absence of quadrature signal supplied from phase control stage 90 (i.e., when the received burst signal and the reference signal from oscillator stage 60 exhibits a quadrature relationship).

A vector $P_1$ represents the quadrature signal from phase control stage 90 when the relationship between the burst signal control and the signal from oscillator stage 60 deviates from the norm in one extreme (i.e., maximum control signal output of one sense from AFPC detector 32). For this condition, the magnitude of quadrature signal $P_1$ equals, for example, that of the oscillator signal $R_o$, and a resultant signal $R_1$ with a phase angle $\theta_1$ of about +45° relative to $R_o$ is produced when signals $P_1$ and $R_o$ are combined in resistor 69. When a smaller/phase frequency deviation of the same sense exists producing a smaller control signal from AFPC detector 32, a resultant signal $R_2$ with a phase angle $\theta_2$ is produced when oscillator signal $R_o$ and a smaller portion of the quadrature signal, $P_2$ are combined. When the desired relationship between the burst and oscillator signals deviates in the other extreme, an opposite polarity quadrature signal $p_3$ is supplied from phase control stage 90. For this condition, the magnitude of signal $P_3$ equals, for example, that of oscillator signal $R_o$, and a resultant signal $R_3$ with a phase angle $\theta_3$ of about −45 ° relative to $R_o$ is produced when signals $P_3$ and $R_o$ are combined.

By virtue of the operation described above, a predictable and substantially symmetrical phase control range of about 90°(i.e., ±45° can be expected for the combined signal developed across resistor 69. The combined signal is coupled by transistor 70 to resonant circuit 63 of oscillator stage 60, and serves to adjust the operating frequency and phase of oscillator stage 60. The change in operation frequency is a function of the bandwidth of resonant circuit 63 and the amount of phase shift introduced into the oscillator loop as determined by the combined signal developed across resistor 69. Accordingly, the frequency change ($\Delta f$) of oscillator stage 60 may be mathematically defined by the expression:

$$\Delta f = \tfrac{1}{2} B \tan\theta$$

where:
  $B$ = the bandwidth of resonant circuit 63, and
  $\theta$ = the phase angle of the combined signal developed across resistor 69.

The operating frequency of oscillator stage 60 remains unchanged in the absence of quadrature signal supplied to resistor 69 from phase control stage 90, when the oscillator signal frequency and the burst signal frequency are substantially equal. The signal developed across resistor 69 and supplied to resonant circuit 63 therefore corresponds to the oscillator reference signal at the nominal 0°reference phase. Positive or negative deviations from the desired frequency relationship result in corresponding positive or negative amounts of quadrature signal being supplied from phase control stage 90, to form a resultant signal with a phase angle $\theta$ representative of the frequency deviation when the quadrature signal and the reference signal are combined in resistor 69. The operating frequency of oscillator stage 60 is altered according to the above expression to correspond to the frequency of the burst signal, and the net phase shift around the feedback loop of oscillator stage 60 remains zero for sustaining oscillation.

In addition to exhibiting a predictable and symmetrical control range, voltage controlled oscillator 55 when used in a color television receiver also conveniently provides in-phase and quadrature phase oscillatory reference signals for demodulating the B-Y and R-Y color difference subcarrier signals. In this case, the (R-Y) and (B-Y) reference signals are respectively developed by oscillator stage 60 and phase shift network 80. Other relationships may, of course, be employed. For example, the output of oscillator stage 60 may be shifted 90° by coupling the input of AFPC detector 32 to the output of phase shifter 80.

It is noted that resistor 64 is dimensioned to provide a bandwidth for resonant circuit 63 on the order of 1000 Hz (centered about the nominal 3.58 MHz oscillator frequency) at the −3 db point. The 1000 Hz bandwidth contributes to a ±500 Hz pull-in range for oscillator stage 60 which is adequate in view of typcially encountered oscillator drift attributable to the effects of temperature and humidity changes upon crystal 65, for example. Such a bandwidth also allows adequate circuit gain without introducing a tendency for producing spurious signals. Resistor 64 in conjunction with capacitor 67 also operates to attenuate higher order signal harmonics or overtones which may be developed as a result of the presence of parasitic capacitance across the terminals of crystal 65. Such an attenuator arrangement avoids the adverse effects of overtone oscillation without impairing feedback loop gain.

It is aso noted that phase shift network 80 may be selected to provide other than a 90° phase shift, depending upon the requirements of the apparatus with which the controlled oscillator is employed. A phase shift network 80 of the type disclosed exhibits the desirable inherent feature of providing a predetermined amount of phase shift at resonance independent of loading of the phase shift network by subsequent circuitry. Phase shift network 80 causes minimum insertion phase error and therefore is advantageously used in circuits where a nominal phase should be preserved.

The inductor 82 of phase shift network 80 is relatively inexpensive and readily available. The inductor 82 need not exhibit a high tolerance, and variations in the value of the inductance due to aging and temperature changes can be tolerated.

The relatively low Q (approximately unity in this case) selected for phase shift network 80 results in a bandwidth which is considerably greater than the bandwidth of high Q resonant circuit 63. Phase shift network 80 therefore does not introduce unwanted reactive phase shift components which would impair the operation of oscillator stage 60. A further desirable consequence of the broad bandwidth of phase shift network 80 is that capacitor 67 is permitted to filter harmonics which may be produced by crystal 65 without introducing additional unwanted phase shift.

Although the invention has been disclosed in terms of a particular circuit embodiment, it should be recognized that other arrangements may be devised by those skilled in the art without departing from the scope of the invention. For example, active signal combining circuits may be used in place of disclosed combining resistor 69, and other arrangements may be employed instead of disclosed LC network 80 to provide the phase shifted (quadrature) signal. In addition, control signal may be supplied to transistors 95, 96 of phase control stage 90 in single-ended or balanced fashion. Furthermore, the roles of the upper and lower sections of phase control stage 90 may be reversed.

What is claimed is:

1. A controllable oscillator comprising:
   amplifier means having an input and an output;
   reactive means having a predetermined resonant frequency response coupled in a closed circuit loop between said input and output of said amplifier means for providing regenerative feedback of sufficient magnitude to produce an oscillatory signal having a reference phase at said output;
   means coupled to said output for phase shifting said oscillatory signal a predetermined amount in relation to said reference phase to produce a phase shifted signal;
   means for providing control signals representative of the phase and/or frequency of said oscillatory signal with respect to a predetermined reference signal;
   control means coupled to said phase shifting means for receiving said phase shifted signal to produce anti-phase signal outputs and responsive to said control signals for providing controllable amounts of said anti-phase output signals;
   means for combining said controllable amounts of said anti-phase output signals from said control means with said oscillatory reference signal to produce a combined signal having a resultant phase; and
   means for supplying said combined signal to said amplifier means for maintaining said oscillatory signal in desired relation with said predetermined reference signal.

2. An oscillator according to claim 1, wherein said means for phase shifting said oscillatory signal and said control means are coupled outside of said closed circuit feedback loop of said amplifier means.

3. An oscillator according to claim 1, wherein said control means comprises:
   a balanced amplifier having a signal input for receiving said phase shifted signal, a control input for receiving said control signals, and an output for providing controllable amounts of said phase shifted signal in response to said control signal.

4. An oscillator according to claim 1, wherein said control means comprises a balanced amplifier including:
   a first amplifier with a signal input and anti-phased ouputs;
   a second amplifier similar to said first amplifier with a signal input and anti-phased outputs;
   a third amplifier with an input supplied with said phase shifted signal and anti-phased outputs respectively coupled to said signal inputs of said first and second amplifiers;
   means for applying said control signals to said first and second amplifiers to vary the relative conduction thereof; and
   means for summing relatively anti-phased outputs of said first and second amplifiers to provide a combined output signal for said balanced amplifier corresponding to a portion of said phase shifted signal with a magnitude and polarity determined by the magnitude and polarity of said control signals.

5. An oscillator according to claim 4, wherein:
   said first amplifier comprises a first pair of first and second emitter coupled transistors;
   said second amplifier comprises a second pair of third and fourth emitter coupled transistors, said second and third transistors having collector electrodes coupled together and to a source of operating potential, said first and fourth transistors having collector electrodes coupled together to form a signal summing output, said first and third transistors having base electrodes connected together, said second and fourth transistors having base electrodes connected together, at least one of said pairs of interconnected base electrodes being supplied with said control signal;
   said third amplifier comprises a third pair of fifth and sixth emitter coupled transistors having collectors respectively connected to the joined emitters of said transistors of said first and second pairs, having emitters connected in common to a source of direct operating current and having similarly biased base electrodes at least one of which is supplied with said phase shifted signal; and
   said summing means being coupled to said signal summing output to provide said combined output signal corresponding to a portion of said phase shifted signal with a magnitude and polarity determined by the magnitude and polarity of said control signals.

6. An oscillator according to claim 5, wherein said combining means comprises a broad bandwidth impedance.

7. An oscillator according to claim 6, wherein said broad bandwidth impedance comprises a resistance.

8. An oscillator according to claim 1, wherein said means for phase shifting said oscillatory signal comprises a series resonant LC network.

9. An oscillator according to claim 8, wherein said LC network comprises:
   an inductor supplied at one end with said oscillatory signal; and
   a parallel combination of a resistance and a capacitance coupled to the other end of said inductor to form a relatively low Q resonant network therewith.

10. Signal processing apparatus comprising:
first means for providing a first signal having a reference phase;
second means for providing a second signal intended to be in predetermined phase relation with said first signal;
third means coupled to said second means for providing a third signal in predetermined phase relation with said second signal;
fourth means coupled to said first and second means for providing control signals representative of the phase of said first signal with respect to said second signal;
control means coupled to said third means for receiving said third signal to produce anti-phase signal outputs and responsive to said control signals for providing controllable amounts of said anti-phase output signals;
means for combining said controllable amounts of said anti-phase output signals from said control means with said second signal to produce a combined signal having a resultant phase corresponding to said reference phase; and
utilization means for receiving said combined signal.

11. Apparatus according to claim 10, wherein said means for combining said first signal and said output signal from said control means comprises a resistive network.

12. Apparatus according to claim 10, wherein said control means comprises a balanced amplifier including:
first and second similar differential amplifiers and a third differential amplifier supplied with said second signal, said first and second differential amplifiers being supplied with said second signal from said third differential amplifier and responsive to said control signal for controlling the relative conduction thereof, and wherein relatively anti-phased outputs of said first and second differential amplifiers are combined to produce an output signal corresponding to a portion of said second signal with a magnitude and polarity determined by the magnitude and polarity of said control signal.

13. Apparatus according to claim 10 wherein:
said first means comprises an oscillator for generating said first signal; and
said utilization means comprises a reactive frequency-determining feedback circuit for said oscillator, said reactive circuit being responsive to said combined output signal with said resultant phase for altering the operating frequency of said oscillator.

14. In a color television receiver adapted to receive and process a color television signal including a chrominance information component and a color synchronizing burst component having a prescribed phase and frequency, a controlled oscillator comprising:
an oscillation amplifier with an input and an ouput;
a reactive filter network, including a crystal, having a frequency response characteristic centered relatively about said frequency of said burst component, coupled in a closed loop between said input and output of said oscillation amplifier for providing regenerative feedback of sufficient magnitude to produce an oscillatory signal with a frequency substantially equal to said burst component frequency and with a reference phase;
a phase shift network coupled to said output for phase shifting said oscillatory signal and a predetermined amount with respect to said reference phase to produce a phase shifted signal;
a source of control signals representative of the frequency and/or phase of said oscillatory signal with respect to said burst component;
a controllable amplifier supplied with said phase shifted signal to produce anti-phase signal outputs and responsive to said control signals for providing controllable amounts of said anti-phase ouput signals in accordance with the magnitude and polarity of said control signals;
a combining network coupled to said oscillation amplifier and to said controllable amplifier for summing said oscillatory signal and said controllable amounts of said anti-phase output signals to produce a combined signal having a resultant phase; and
means for coupling said combined signal to said reactive filter network to proudce an oscillatory signal in desired frequency and phase synchronism with said burst component.

15. The oscillator according to claim 14, wherein said phase shift network provides a phase shifted signal in quadrature relation with said oscillatory signal.

* * * * *